US012584236B2

(12) United States Patent
Lee et al.

(10) Patent No.: US 12,584,236 B2
(45) Date of Patent: Mar. 24, 2026

(54) CHAMBER COATING MATERIAL AND METHOD FOR MANUFACTURING THE SAME

(71) Applicant: GREEN RESOURCE CO., LTD., Incheon (KR)

(72) Inventors: Jong Beom Lee, Incheon (KR); Jong Soo Lee, Incheon (KR); Byounggook Kwon, Incheon (KR)

(73) Assignee: GREEN RESOURCE CO., LTD., Incheon (KR)

( * ) Notice: Subject to any disclaimer, the term of this patent is extended or adjusted under 35 U.S.C. 154(b) by 0 days.

(21) Appl. No.: 17/909,476

(22) PCT Filed: Mar. 11, 2020

(86) PCT No.: PCT/KR2020/003386
§ 371 (c)(1),
(2) Date: Sep. 6, 2022

(87) PCT Pub. No.: WO2021/177502
PCT Pub. Date: Sep. 10, 2021

(65) Prior Publication Data
US 2024/0328027 A1 Oct. 3, 2024

(30) Foreign Application Priority Data

Mar. 6, 2020 (KR) ........................ 10-2020-0028372

(51) Int. Cl.
*C23C 16/44* (2006.01)
*C23C 14/00* (2006.01)
(Continued)

(52) U.S. Cl.
CPC ............ *C30B 1/023* (2013.01); *C23C 14/022* (2013.01); *C23C 14/081* (2013.01);
(Continued)

(58) Field of Classification Search
CPC ... C23C 14/022; C23C 14/081; C23C 14/083; C23C 14/10; C23C 14/24
See application file for complete search history.

(56) References Cited

U.S. PATENT DOCUMENTS 5,532,495 A * 7/1996 Bloomquist ............ B29C 59/16
250/492.1
6,797,335 B1 * 9/2004 Paderov .............. C23C 14/5886
428/689
(Continued)

FOREIGN PATENT DOCUMENTS

CN 106119765 11/2016
JP 2007-321183 12/2007
(Continued)

OTHER PUBLICATIONS

Laura Granados et al. Silicate glass-to-glass hermetic bonding for encapsulation of next-generation optoelectronics: A Review. Elsevier. Material Today. vol. 47. Jul./Aug. 2021 (Year: 2021).*
(Continued)

*Primary Examiner* — Dah-Wei D. Yuan
*Assistant Examiner* — Kristen A Dagenais
(74) *Attorney, Agent, or Firm* — LEX IP MEISTER, PLLC

(57) ABSTRACT

A method for manufacturing a coating material formed on an inner surface of a chamber is provided. The method includes: i) providing a substrate including at least one material selected from the group consisting of SiC, $SiO_2$, and $Al_2O_3$; ii) providing a first coating portion including $SiO_x$ ($0.1 \leq x \leq 2$ as a molar ratio) or $AlO_y$ ($0.1 \leq y \leq 1.5$ as a molar ratio) on the substrate; iii) providing a second coating portion including $YO_z$ ($0.1 \leq z \leq 1.5$ as a molar ratio) on the first coating portion; iv) providing a laminate in which the first coating portion and the second coating portion are repeatedly stacked; and v) heating the laminate to provide a
(Continued)

$AlO_y$ coating layer

| A1 |
| --- |

| Element | at% |
| --- | --- |
| O | 37.13 |
| Al | 62.97 |

| A2 |
| --- |

| Element | at% |
| --- | --- |
| O | 37.58 |
| Al | 62.44 |

$YO_z$ coating layer

| Y1 |
| --- |

| Element | at% |
| --- | --- |
| O | 16.37 |
| Y | 83.63 |

| Y2 |
| --- |

| Element | at% |
| --- | --- |
| O | 15.96 |
| Y | 84.04 | coating layer of a single crystalline layer by a solid-state reaction between the first coating portion and the second coating portion.

10 Claims, 15 Drawing Sheets

(51) Int. Cl.

| | |
|---|---|
| *C23C 14/02* | (2006.01) |
| *C23C 14/08* | (2006.01) |
| *C23C 14/10* | (2006.01) |
| *C23C 14/24* | (2006.01) |
| *C23C 14/58* | (2006.01) |
| *C30B 1/02* | (2006.01) |
| *H01J 37/32* | (2006.01) |

(52) U.S. Cl.
CPC ............ *C23C 14/083* (2013.01); *C23C 14/10* (2013.01); *C23C 14/24* (2013.01); *H01J 37/32495* (2013.01)

(56) References Cited

U.S. PATENT DOCUMENTS

| | | | | |
|---|---|---|---|---|
| 2008/0008839 A1* | 1/2008 | Lee | ......................... | C23C 28/42 |
| | | | | 427/404 |
| 2011/0006449 A1* | 1/2011 | Mukherjee | ............. | B82Y 30/00 |
| | | | | 264/10 |
| 2015/0044444 A1* | 2/2015 | Gell | ......................... | C23C 4/10 |
| | | | | 415/230 |
| 2015/0079370 A1* | 3/2015 | Sun | ........................... | C23C 4/18 |
| | | | | 427/454 |
| 2018/0337026 A1* | 11/2018 | Firouzdor | ......... | C23C 16/45525 |
| 2019/0382880 A1* | 12/2019 | He | ...................... | C23C 16/0281 |

FOREIGN PATENT DOCUMENTS

| | | |
|---|---|---|
| JP | 2009-280483 | 12/2009 |
| JP | 6384536 | 9/2018 |
| JP | 2018-164103 | 10/2018 |
| JP | 6443380 | 12/2018 |
| JP | 2019-085650 | 6/2019 |
| KR | 10-2017-0021103 | 2/2017 |
| KR | 10-2018-0055516 | 5/2018 |
| KR | 10-2018-0086161 | 7/2018 |
| KR | 10-1961411 | 3/2019 |
| KR | 10-2019-0086470 | 7/2019 |
| TW | 201945311 | 12/2019 |
| WO | 2019-206188 | 10/2019 |

OTHER PUBLICATIONS

KIPO, A PCT Search Report & Written Opinion of Application No. PCT/KR2020/003386, dated Nov. 30, 2020.

* cited by examiner

AlO$_y$ coating layer

| Element | at% |
|---------|-----|
| O | 37.13 |
| Al | 62.87 |

| Element | at% |
|---------|-----|
| O | 37.56 |
| Al | 62.44 |

YO$_z$ coating layer

| Element | at% |
|---------|-----|
| O | 16.37 |
| Y | 83.63 |

| Element | at% |
|---------|-----|
| O | 15.96 |
| Y | 84.04 |

CHAMBER COATING MATERIAL AND METHOD FOR MANUFACTURING THE SAME

TECHNICAL FIELD

The present invention relates to a chamber coating material and its manufacturing method. More specifically, the present invention relates to a chamber coating material having corrosion resistance even in plasma or a strong corrosive atmosphere, and a method for manufacturing the same.

BACKGROUND ART

In recent years, due to the rapid development of the mobile industry, miniaturization and high integration of semiconductors and the like are more urgently required. Therefore, in order to highly integrate semiconductors, new technologies for stacking in 3D form are being developed, and in this case, a different process from the existing semiconductor process is required. That is, since it is necessary to form the device in an erected state, then quickly etch and remove a specific part in a short time, an etching gas or solution having strong corrosiveness is required.

By using such an etchant having strong acidity, the window or inner wall in the chamber for manufacturing the device is corroded. That is, as the inner surface of the chamber comes into contact with plasma in which a reactive halogen gas is injected or a strong acid etching atmosphere, resulting aggregates fall and contaminate the device being manufactured. Therefore, it is necessary to prepare a coating material capable of maintaining corrosion resistance even in plasma or a strongly acidic atmosphere in which reactive halogen gas is injected.

DISCLOSURE

Technical Problem

A coating material for a corrosion-resistant chamber for plasma or a strong corrosive atmosphere is provided. In addition, a method for manufacturing the aforementioned coating material is provided.

Technical Solution

The method of manufacturing a coating material for a chamber according to an embodiment of the present invention includes: i) providing a substrate including at least one material selected from the group consisting of SiC, SiO$_2$, and Al$_2$O$_3$; ii) providing a first coating portion including SiO$_x$ (0.1≤x≤2 as a molar ratio) or AlO$_y$ (0.1≤y≤1.5 as a molar ratio) on the substrate; iii) providing a second coating portion including YO$_z$ (0.1≤z≤1.5 as a molar ratio) on the first coating portion; iv) providing a laminate in which the first coating portion and the second coating portion are repeatedly stacked; and v) heating the laminate to provide a coating layer of a single crystalline layer by a solid-state reaction between the first coating portion and the second coating portion.

The substrate may include the SiC in the providing the substrate. The first coating portion may include the SiO$_x$ (0.1≤x≤2 as a molar ratio) in the providing the first coating portion. The laminate may be heated at 1000° C. to 1500° C., and the coating layer may include at least one material selected from the group consisting of Y$_2$SiO$_5$ and Y$_2$Si$_2$O$_7$ in the providing the coating layer. The ratio of the thickness of the second coating portion to the thickness of the first coating portion may be 1.7 to 2 when the laminate may include Y$_2$SiO$_5$ in the providing the laminate. The ratio of the thickness of the second coating portion to the thickness of the first coating portion may be 0.8 to 1.25 when the laminate may include Y$_2$Si$_2$O$_7$ in the providing the laminate. The x may be 0.1 to 1 as a molar ratio in the providing the first coating portion, and the z may be 0.1 to 1 as a molar ratio in the providing the second coating portion.

The substrate may include the Al$_2$O$_3$ in the providing the substrate. The first coating portion may include the AlO$_y$, (0.1≤y≤1.5 as a molar ratio) in the providing the first coating portion. The laminate may be heated at 1000° C. to 1500° C., and the coating layer may include Y$_\alpha$Al$_\beta$O$_\gamma$ (2.5≤α≤3.5, 4.5≤β≤5.5, 11.5≤γ≤12.5 as a molar ratio) in the providing the coating layer.

The substrate may include the Al$_2$O$_3$ in the providing the substrate. The first coating portion may include the AlO$_y$, (0.1≤y≤1.5 as a molar ratio) in the providing the first coating portion. The laminate may be heated at 1000° C. to 1500° C., and the coating layer may include at least one compound selected from the group consisting of Y$_3$Al$_5$O$_{12}$, YAlO$_4$ and Y$_4$Al$_2$O$_9$ in the providing the coating layer. The ratio of the thickness of the second coating portion to the thickness of the first coating portion may be 0.8 to 1.2 when the coating layer includes Y$_3$Al$_5$O$_{12}$ in the providing the laminate. The ratio of the thickness of the second coating portion to the thickness of the first coating portion may be 1.3 to 1.8 when the coating layer includes YAlO$_4$ in the providing the laminate. The ratio of the thickness of the second coating portion to the thickness of the first coating portion may be 1.6 to 2.5 when the coating layer includes Y$_4$Al$_2$O$_9$ in the providing the laminate.

The y may be 0.1 to 1 in the providing the first coating portion, and the z may be 0.1 to 1 in the providing the second coating portion. The laminate may be heated to 800° C. to 1300° C., the thickness of the coating layer is smaller than the thickness of the laminate, and the ratio of the thickness of the laminate to the thickness of the coating layer may be 1.25 to 1.6 in the providing the coating layer. The first coating portion and the second coating portion may be repeatedly stacked 2 to 10 times in the providing the laminate.

The method of manufacturing a coating material for a chamber according to an embodiment of the present invention may further include treating a surface of the substrate between the providing the substrate and the providing the first coating portion. The surface treatment may be performed by plasma or an ion beam, and the surface roughness (Ra) of the substrate may be in a range from 0.1 μm to 0.3 μm. When the surface treatment is performed by the ion beam, the ion beam power may be 0.5 KW to 3 KW.

The coating material according to an embodiment of the present invention may be manufactured by the above-described methods.

Advantageous Effects

A coating material for a chamber containing Y$_2$SiO$_5$ or YAG having corrosion resistance against plasma or a strong corrosive atmosphere can also be prepared. Therefore, it is possible to prevent contamination of the device due to the drop of foreign substances due to corrosion of the inner wall of the chamber.

BEST MODE

The terminology used herein is for the purpose of referring to specific embodiments only, and is not intended to limit the invention. As used herein, the singular forms also include the plural forms unless the phrases clearly indicate the opposite. The meaning of "comprising," as used herein, specifies a particular characteristic, region, integer, step, operation, element and/or component, and other specific characteristic, region, integer, step, operation, element, component, and/or group. It does not exclude the existence or addition of Although not defined otherwise, all terms including technical and scientific terms used herein have the same meaning as commonly understood by those of ordinary skill in the art to which the present invention belongs. Commonly used terms defined in the dictionary are additionally interpreted as having a meaning consistent with the related art literature and the presently disclosed content, and unless defined, are not interpreted in an ideal or very formal meaning.

More specifically, the term "element" used hereinafter means "component included in electric or electronic device". The component may be an OLED panel or a semiconductor, but is not limited thereto, and may be another object.

Hereinafter, exemplary embodiments of the present invention will be described in detail with reference to the accompanying drawings so that those skilled in the art to which the present invention pertains can easily practice it. However, the present invention can be implemented in many different forms and is not limited to the embodiments described herein.

Figure 1:
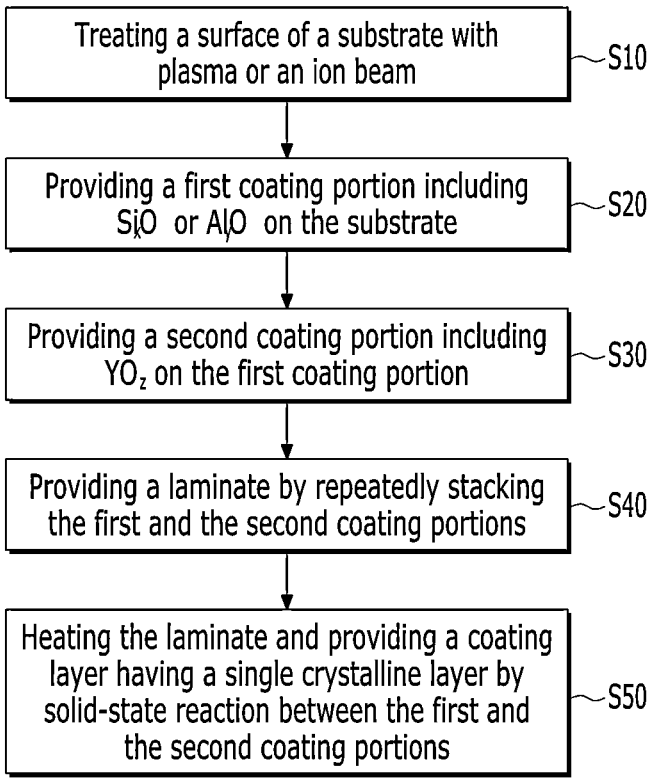
FIG. 1 is a schematic flowchart of a method for manufacturing a chamber coating material for manufacturing a device according to a first embodiment of the present invention.

FIG. 1 schematically shows a flowchart of a method for manufacturing a chamber coating material according to an embodiment of the present invention. The method for manufacturing the chamber coating material of FIG. 1 is only for illustrating the present invention and the present invention is not limited thereto. Therefore, the method for manufacturing the chamber coating material can be modified to other forms.

As shown in FIG. 1, the method for manufacturing a chamber coating material includes treating a surface of a substrate with plasma or an ion beam S10, providing a first coating portion including $SiO_x$ or $AlO_y$ on the substrate S20, providing a second coating portion including $YO_z$ on the first coating portion S30, providing a laminate by repeatedly stacking the first and second coating portions S40, and heating the laminate and providing a coating layer having a single crystalline layer by solid-state reaction between the first and second coating portions S50. In addition, the method for manufacturing the coating material may further include other steps if necessary.

FIGS. 2 and 4 to 7 schematically show the cross-sectional structure of the coating layer prepared in each step of FIG. 1. The cross-sectional structures of FIGS. 2 and 4 to 7 are only for illustrating the present invention and the present invention is not limited thereto. Therefore, the cross-sectional structures shown in FIGS. 2 and 4 to 7 can be modified into other forms. Hereinafter, a method for manufacturing the chamber coating material will be described with reference to FIGS. 1 to 7.

As shown in FIG. 1, in step S10, a substrate 10 (FIG. 2, hereinafter referred to the same) is provided, and the surface thereof is treated with plasma or an ion beam. The substrate 10 may be an inner wall of the chamber for manufacturing the device. The device can be a semiconductor or a display. During a process for manufacturing the device, the substrate 10 may be corroded by direct contact with a corrosive atmosphere in the chamber, particularly plasma. Therefore, the surface of the substrate 10 is covered with a coating material having corrosion resistance to prevent the substrate 10 from directly contacting a corrosive atmosphere. As a substrate, SiC, $SiO_2$, or $Al_2O_3$ may be used. In addition, AlN, $Al_2O_3$—$Y_2O_3$, or the like can also be used.

Figure 2:
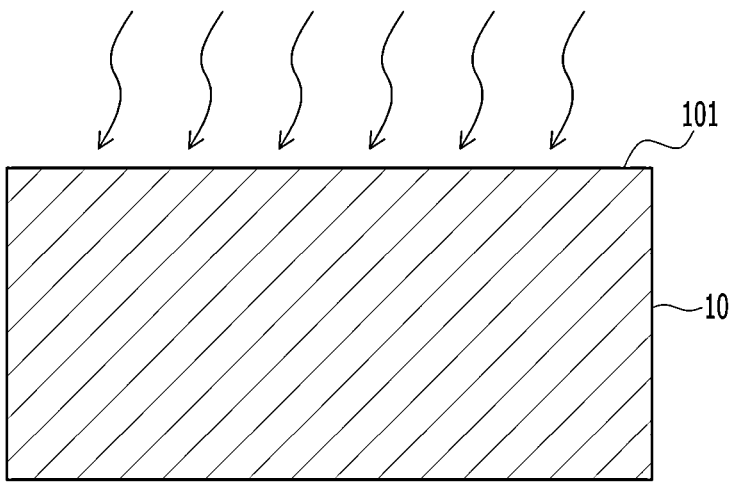
FIG. 2 is a schematic graph showing a status when a surface of the substrate is treated by plasma or ion beam.

As shown in FIG. 2, the surface 101 of the substrate 10 is treated to increase the adhesion of the coating layer to be attached thereon in a subsequent process. The surface can be treated with an ion beam or plasma. In particular, multiple coating layers are located over the substrate 10 in a subsequent process. Therefore, it is necessary to improve the adhesion of the substrate 10 and the layers to be stacked thereon. Therefore, the surface 101 of the substrate 10 is treated.

Figure 3:
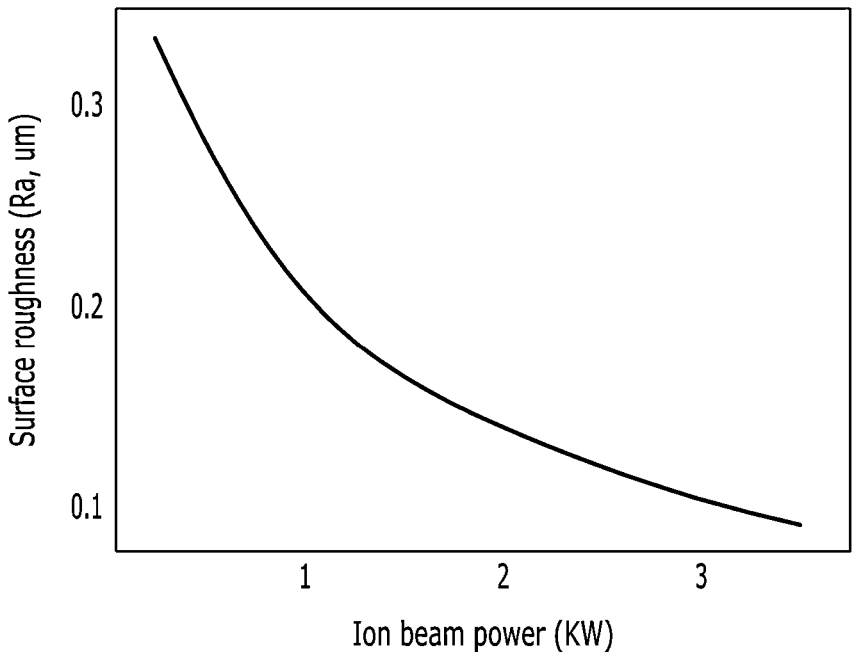
FIG. 3 is a graph in the case of treating the surface of a substrate with an ion beam.
Figure 4:
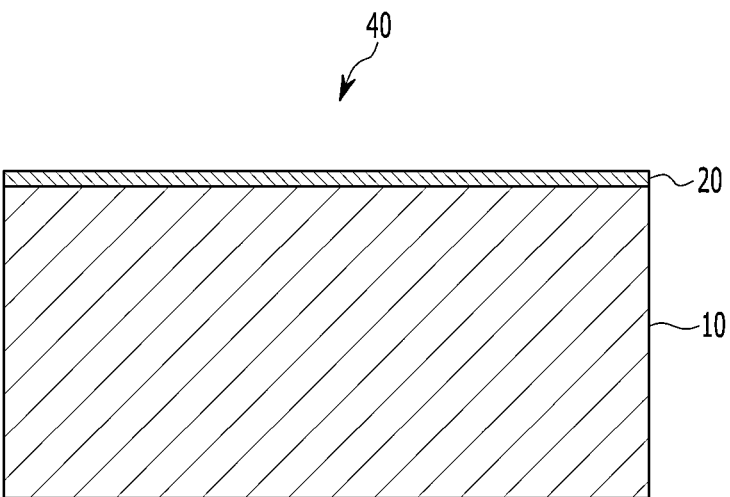
FIGS. 4 to 7 are schematic cross-sectional views of the coating layer formed at each step of a method of manufacturing the chamber coating material.
Figure 5:
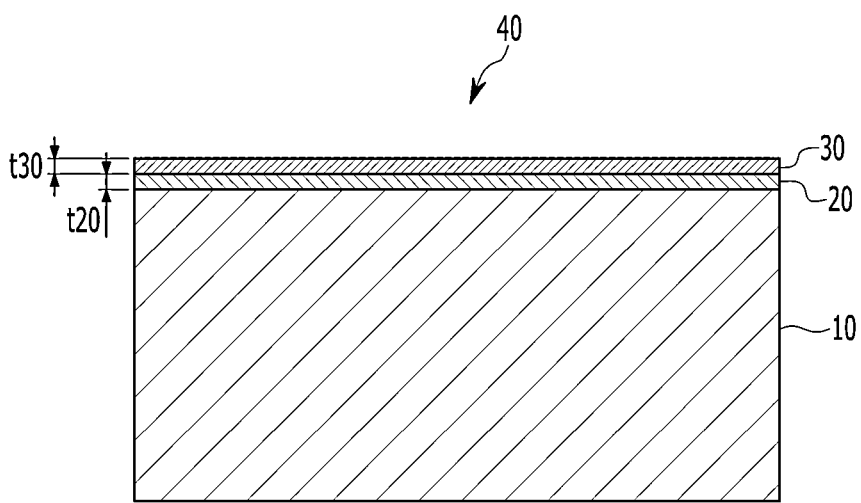

FIG. 3 shows a graph in the case of surface-treating the surface 101 of the substrate 10 with an ion beam. FIG. 3 is only for illustrating the present invention, and the present invention is not limited thereto. Therefore, the ion beam process of FIG. 3 may be modified into other forms.

As shown in FIG. 3, the surface 101 is subjected to ion beam treatment. The roughness of the surface 101 may be gradually lowered by gradually increasing the ion beam power. That is, the surface 101 is planarized by the ion beam treatment to lower the surface roughness. In addition, through cleaning and activation of the surface 101, adhesion between the coating layers to be attached to the surface 101 in a subsequent process and the surface 101 may be improved. Preferably, the ion beam power may be 0.5 KW to 3 KW. When the ion beam power is too low, a desired surface roughness cannot be obtained. In addition, when the ion beam power is too high, the energy consumption increases, thereby increasing the process cost. Therefore, the ion beam power is adjusted within the above-described range. To this end, the surface 101 may be irradiated with an ion beam for 5 to 60 minutes. As a result, the surface roughness Ra of the surface 101 may be 0.1 $\mu$m to 0.3 $\mu$m. When the surface roughness is too large, the surface 101 is not well planarized, so it may be difficult to laminate a plurality of coating layers in a subsequent process. In addition, when the surface roughness is too low, there is a problem in that the ion beam treatment time is long and the process cost increases. Therefore, it is preferable to maintain the surface roughness of the surface 101 in the above-mentioned range.

Meanwhile, the surface 101 may be treated with plasma. That is, the surface 101 is treated with plasma while the plasma collides with the surface 101 of the substrate 10. Plasma is an ionized gas and is composed of photons, ions, electrons, decomposed gas, and radicals. Therefore, the surface 101 is modified by physically and chemically reacting with the plasma. That is, the surface 101 is homogenized and its adhesion is improved when a coating layer is formed in a subsequent process.

Returning to FIG. 1, in the step S20 of FIG. 1, a first coating portion 20 is provided on the substrate 10 (shown in FIG. 3, hereinafter referred to the the same). The first coating portion 20 includes $SiO_x$ or $AlO_y$. Here, x may be 0.1 to 2 in a molar ratio. More preferably, x may be 0.1 to 1. In addition, in a molar ratio, y may be 0.1 to 1.5. More preferably, y may be 0.1 to 1. If the value of x or y is too high, a large amount of oxygen may be mixed, and the coating layer prepared in a subsequent process may be easily broken. Further, when the value of x or y is too low, it is difficult for silicon or aluminum to form a stable oxide. Therefore, it is desirable to keep the molar ratio within the above-mentioned range. The first coating portion 20 may be formed on the substrate 10 by physical vapor deposition. Therefore, since the first coating portion 20 can be formed by an in-situ process, process control is easy. On the other hand, when using thermal spraying, process control is difficult.

The thickness t20 (shown in FIG. 4) of the first coating portion 20 may be 0.4 $\mu$m to 1 $\mu$m. If the thickness t20 is too small, mutual diffusion with the second coating portion 30 provided in a subsequent process is not achieved well. In addition, if the thickness t20 is too large, the material cost is high and the process time becomes long. Therefore, it is preferable to keep the thickness t20 in the above-described range.

On the other hand, if the substrate 10 includes SiC, it is preferable that the first coating portion 20 includes the above-described $SiO_x$. In this case, since both the substrate 10 and the first coating portion 20 contain Si, the first coating portion 20 is attached well on the substrate 10. As a result, the first coating portion 20 is not peeled off from the substrate 10 by thermal stress when the coating material prepared in the subsequent process is actually used.

If the substrate 10 includes $Al_2O_3$, it is preferable that the first coating portion 20 includes the above-described $AlO_y$. In this case, since both the substrate 10 and the first coating portion 20 include Al, the first coating portion 20 is attached well on the substrate 10. As a result, the first coating portion 20 is not peeled off from the substrate 10 by thermal stress when the coating material prepared in the subsequent process is actually used.

Figure 6:
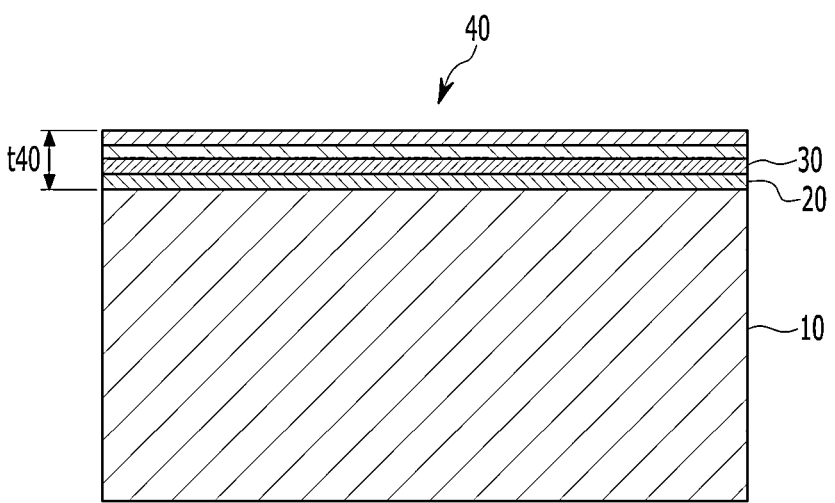

Next, in step S30, the second coating portion 30 is provided on the first coating portion 20 (shown in FIG. 6). The second coating portion 30 includes $YO_2$. Here, z may be 0.1 to 1.5. More preferably, z may be 0.1 to 1. If the value of z is too high, the coating layer may be hardened due to the incorporation of a large amount of oxygen. In addition, if the value of z is too small, there is a problem that yttrium is difficult to form as a stable oxide. Therefore, it is preferable to maintain z in the above-mentioned range. The second coating portion 30 may be formed in the same way as the first coating portion 20. For example, the second coating portion 30 is attached on the first coating portion 20 by evaporating yttria by a physical vapor deposition method. Yttria has excellent chemical and corrosion resistance. In particular, yttria has excellent plasma corrosion resistance. Therefore, it is suitable to protect the substrate from plasma generated in the chamber.

Meanwhile, the thickness t30 of the second coating portion 30 may be 0.5 $\mu$m to 2.5 $\mu$m. If the thickness t30 is too small, mutual diffusion with the first coating portion 20 is not performed well. In addition, if the thickness t30 is too large, the material cost is high and the process time becomes long. Therefore, it is preferable to keep the thickness t30 in the above-described range.

Next, in step S40 of FIG. 1, the first and second coating portions 20 and 30 are repeatedly stacked to provide a laminate 40. FIG. 6 shows a state in which the first and second coating portions 20 and 30 are repeatedly stacked four times on the substrate 10 as an example. The first and second coating portions 20 and 30 may be stacked repeatedly 2 to 10 times. The difference in thermal expansion coefficient between the substrate and the laminate 40 can be reduced by repeated stacking.

If the stacking of the first and second coating portions 20 and 30 is not repeated, the diffusion between the first and second coating portions 20 and 30 does not easily occur when heated in a subsequent process, and thus uniform coating layer is difficult to be manufactured. Furthermore, if a single layer in which the materials of the first and second coating portions 20 and 30 are mixed is formed without being stacked, the thickness thereof is too thin, and thus corrosion resistance to plasma may be deteriorated. In addition, the materials of the first and second coating portions 20 and 30 cannot be uniformly mixed, thereby the characteristics thereof may be lowered. Therefore, it is preferable to repeatedly stack the first and second coating portions 20 and 30 two or more times. In addition, if the number of times of the stacking of the first and second coating portions 20 and 30 is too many, the manufacturing process time of the coating material is lengthened and the unit cost is increased by using a large amount of material. Therefore, it is preferable to stack the first and second coating portions 20 and 30 within the above-described number of times.

Figure 7:
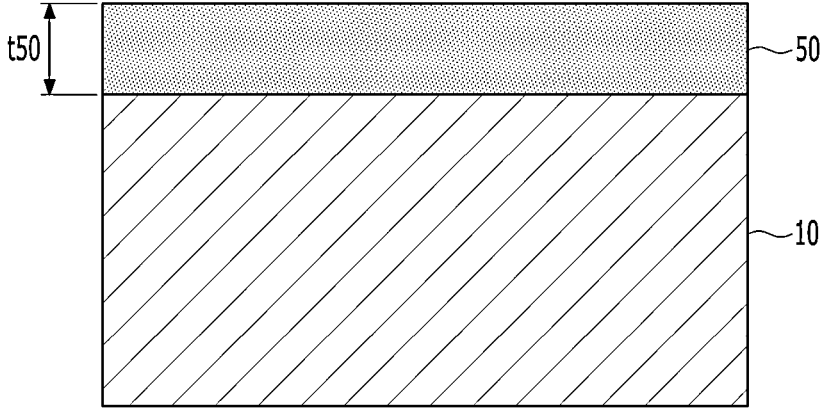

In addition, in step S50 of FIG. 1, the laminate 40 is heat-treated to provide a coating layer 50, thereby forming a coating material 100 including the substrate 10 (shown in FIG. 7). First, if the first coating portion 20 includes the aforementioned $SiO_x$, the coating layer 50 is formed to contain $Y_2SiO_5$ or $Y_2Si_2O_7$ by reaction of $SiO_x$ and $YO_z$. This can control the molar ratio of the Y—Si—O-based compound by adjusting the thickness t20 of the first coating portion 20 and the thickness t30 of the second coating portion 30 in FIG. 4. For example, if the laminate 40 includes $Y_2SiO_5$, the ratio of the thickness t30 of the second coating portion 30 to the thickness t20 of the first coating portion 20 may be 1.7 to 2. If the ratio is lower or higher than this, $Y_2SiO_5$ is not formed, so the ratio is adjusted to the above-mentioned range. On the other hand, if the laminate 40 includes $Y_2Si_2O_7$, the ratio of the thickness t30 of the second coating portion 30 to the thickness t20 of the first coating portion 20 is 1:1.3 to 1:0.8. If the ratio is lower or higher than this, $Y_2Si_2O_7$ is not formed, so the ratio is adjusted to the above-mentioned range.

In addition, if the first coating portion 20 includes the above-described $AlO_y$, the coating layer 50 is formed to include $Y_3Al_5O_{12}$, $YAlO_4$, or $Y_4Al_2O_9$ by the reaction of $AlO_y$ and $YO_z$. This may control the molar ratio of the Y—Al—O-based compound by adjusting the thickness t20 of the first coating portion 20 and the thickness t30 of the second coating portion 30 in FIG. 5. Adhesion at the interface between the first and second coating portions 20 and 30 may be improved by heat treatment.

Figure 8:
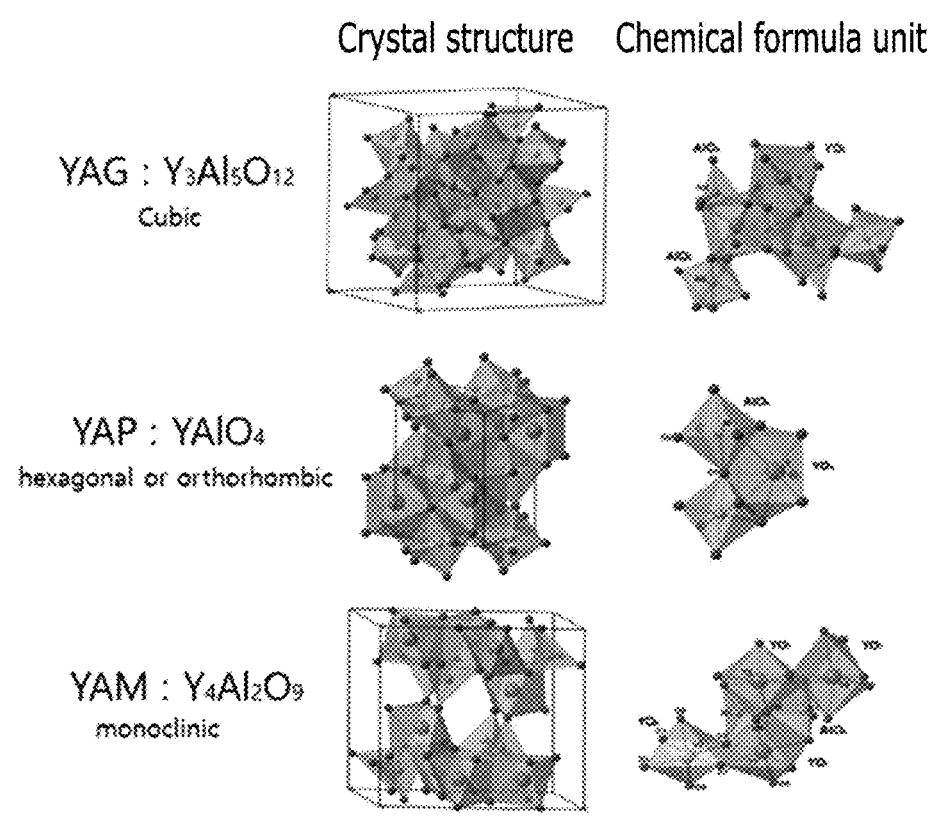
FIG. 8 schematically shows a crystal structure and a chemical formula unit of a coating layer prepared by the method for manufacturing the chamber coating material of FIG. 1.

FIG. 8 shows a crystal structure and chemical unit of the Y—Al—O-based coating layer prepared in this way. Various Y—Al—O-based coating layers such as YAG, YAP, or YAM are prepared by adjusting the thickness t20 of the first coating portion 20 and the thickness t30 of the second coating portion 30 shown in FIG. 5. YAG is a cubic system with the chemical formula $Y_3Al_5O_{12}$, YAP is a hexagonal or tetragonal system with the chemical formula $YAlO_4$, and YAM is a monoclinic system with the chemical formula $Y_4Al_2O_9$. YAP and YAM can be formed according to process conditions.

If the ratio of the thickness t30 of the second coating portion 30 to the thickness t20 of the first coating portion 20 is 0.8 to 1.2, a coating layer 50 including $Y_3Al_5O_{12}$ may be prepared. If the ratio is lower or higher than this, $Y_3Al_5O_{12}$ is not formed, so the ratio is adjusted to the above-mentioned range. In addition, if the ratio of the thickness t30 of the second coating portion 30 to the thickness t20 of the first coating portion 20 is 1.3 to 1.8, a coating layer 50 including $YAlO_4$ may be prepared. If the ratio is lower or higher than this, $YAlO_4$ is not formed, so the ratio is adjusted to the above-mentioned range. In addition, if the ratio of the thickness t30 of the second coating portion 30 to the thickness t20 of the first coating portion 20 is 1.6 to 2.5, a coating layer 50 including $Y_4Al_2O_9$ may be manufactured. If the ratio is lower or higher than this, $Y_4Al_2O_9$ is not formed, so the ratio is adjusted to the above-mentioned range.

In order to form a single-layer coating layer 50, the laminate 40 (shown in FIG. 5, hereinafter referred to the same) may be heated at 800° C. to 1500° C. for 30 minutes to 5 hours. In this case, the single layer is formed to be crystalline. Given the temperature range and temperature time, no amorphous material is formed that may be susceptible to corrosion. If the heating temperature of the laminate 40 is too high, the laminate 40 may be overheated. In addition, if the heating temperature of the laminate 40 is too low, it is not easy for the first coating portion 20 and the second coating portion 30 to be mutually united and form a compound. Therefore, it is preferable to heat the laminate 40 in the above-described temperature range. If the heating time is too short, the coating layer 50 is insufficiently formed. In addition, if the heating time is too long, the coating layer 50 may be deteriorated. Therefore, it is preferable to adjust the heating time in the above-described range.

Returning to FIG. 7, if the laminate 40 is heated through the above-described method, the thickness t50 of the coating layer 50 is smaller than the thickness t40 of the laminate 40. That is, if the laminate 40 is heated to the above-described temperature range, the laminate 40 is contracted to some extent to form a coating layer 50 with a reduced thickness. In this case, a ratio of the thickness t50 of the coating layer 50 to the thickness t40 of the laminate 40 may be 1.1:1 to 1.6:1. If this ratio is too small, the heat treatment time is insufficient, and the components included in the laminate 40 are not evenly mixed and the coating layer 50 is not formed as a single layer. In addition, if this ratio is too large, the laminate 40 may be overheated and cracks may occur. Therefore, it is desirable to keep the ratio in the above-described range. Here, the thickness t50 of the coating layer 50 may be 0.5 μm to 3 μm.

Unlike the exemplary embodiment of the present invention, if the coating layer 50 is formed as a plurality of layers instead of a single layer, the process is complicated, and thermal stress occurs between each layer having different materials and cracks are generated. This is the same in the coating material with a plurality of layers which is generated due to insufficient heat treatment instead of a single layer. On the contrary, in the embodiment of the present invention, since the coating layer 50 having a single layer is finally manufactured, the process is not only simple, but also has excellent plasma corrosion resistance. That is, after laminating a plurality of coating layers 20 and 30, a mutual diffusion reaction therebetween is induced by heat treatment, so that a coating layer 50 having excellent properties can be manufactured.

Hereinafter, the present invention will be described in more detail through experimental examples. These experimental examples are only for illustrating the present invention. The present invention is not limited to this.

Experimental Example 1

A coating layer was formed on the substrate of SiC using the method of FIG. 1. First, the surface of the substrate was plasma treated under 5 KW power conditions. Then, the $SiO_2$ layer and the $Y_2O_3$ layer were repeatedly stacked by physical vapor deposition alternating the silicon source with a coating rate of 3.0 Pa/sec and an oxygen flow of 10 sccm and an yttrium source of 1.5 Pa/sec and a flow rate of 5 sccm of oxygen. Here, the $SiO_2$ layer and the $Y_2O_3$ layer were repeated 4 times to prepare a laminate having a total of 8 layers. Then, the laminate was heated at a temperature of 800° C. to 1300° C. for 180 minutes in an oxygen atmosphere to prepare a coating material. In order to test the prepared coating material, an etching experiment was performed with a volume ratio of $CF_4$:$O_2$ of 95:5 in accordance with a use environment.

Experimental Example 2

A coating layer was formed on the substrate of $Al_2O_3$ using the method of FIG. 1. First, the surface of the substrate was plasma treated under 5 KW power conditions. Then, the $Al_2O_3$ layer and the $Y_2O_3$ layer were repeatedly stacked by physical vapor deposition alternating the aluminum source with a coating rate of 3.0 Pa/sec and an oxygen flow of 10 sccm and an yttrium source with a coating rate of 1.5 Pa/sec and an oxygen flow of 5 sccm. Here, the $Al_2O_3$ layer and the $Y_2O_3$ layer were alternated twice to prepare a laminate having a total of 4 layers. Then, the coating material was prepared by heating the laminate for 300 minutes at 1000° C. to 1400° C. in an oxygen atmosphere. In order to test the prepared coating material, an etching experiment was performed with a volume ratio of $CF_4:O_2$ of 95:5 in accordance with a use environment.

Comparative Example 1

$Al_2O_3$ bulk material mainly used as a substrate was prepared. An etching experiment was performed by setting the volume ratio of $CF_4:O_2$ of 95:5 to $Al_2O_3$ bulk material.

Comparative Example 2

On the substrate made of alumina, $Y_2O_3$ coating material was formed using an APS (atmospheric plasma spray) process. The rest of the processes except the APS process were the same as the Experimental Example 1 described above or followed the general APS test conditions. The $Y_2O_3$ coating material was subjected to an etching experiment with $CF_4:O_2$ volume ratio of 95:5.

Comparative Example 3

$Y_2O_3$ coating was formed on the alumina substrate through physical vapor deposition. The rest of the processes were the same as Experimental Example 1 described above. The $Y_2O_3$ coating material was subjected to an etching experiment with a $CF_4:O_2$ volume ratio of 95:5.

Experiment Result

Coating Structure Observation

Experimental Results of the Experimental Example 1

Figure 9:
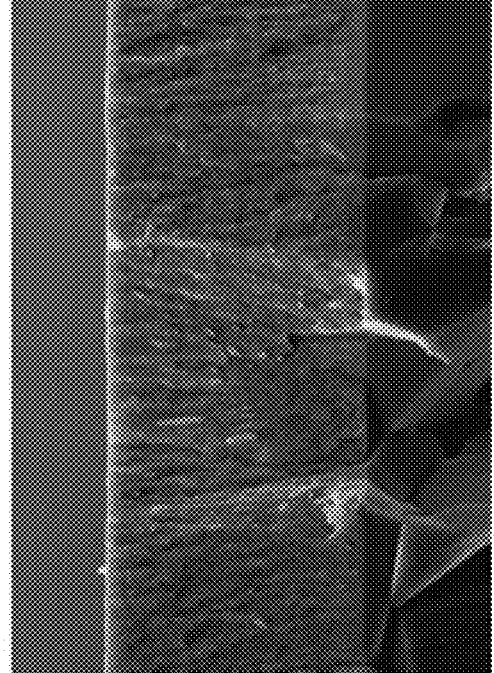
FIG. 9 is a scanning electron microscope photograph of the cross-section of the coating layer prepared before and after heating according to the first experimental example of the present invention.

FIG. 9 shows a scanning electron microscope photograph of the cross-section of the coating material prepared before and after heating according to the first experimental example of the present invention. That is, the left side of FIG. 9 shows a scanning electron microscope photograph of the cross section of the coating material before heating, while the right side of FIG. 9 shows a scanning electron microscope photograph of the cross section of the coating material after heating.

As shown in the photo on the left of FIG. 9, when a laminate is prepared by a physical vapor deposition method, it can be seen that total 8 layers of $SiO_2$ and $Y_2O_3$ are repeatedly formed. As a result of heating the laminate, as shown in the right photo of FIG. 9, it was confirmed that a single layer of $Y_2SiO_5$ (YSO) was formed by nucleation and recrystallization by mutual diffusion of the $SiO_2$ layer and the $Y_2O_3$ layer.

Figure 10:
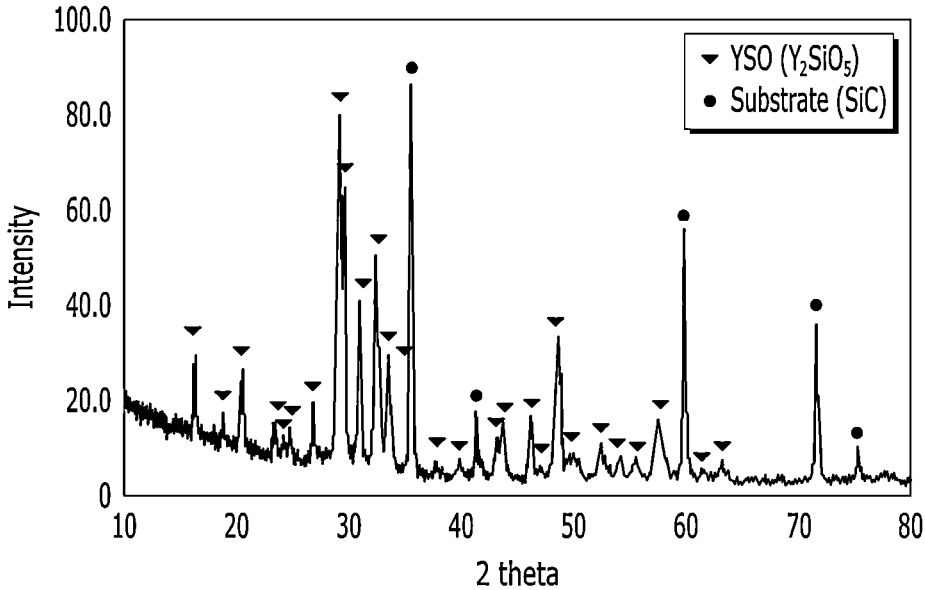
FIG. 10 is an XRD graph of the coating material prepared according to the first experimental example of the present invention.

FIG. 10 shows an XRD graph of the coating material prepared according to the first experimental example of the present invention. As shown in FIG. 10, as a result of XRD experiment, $Y_2SiO_5$ and SiC were detected in the coating material. Here, it was confirmed that SiC is a component of the substrate, while $Y_2SiO_5$ is a component of the coating layer. Therefore, it is confirmed that the coating layer of $Y_2SiO_5$ is formed well through the above-described methods.

Experimental Results of the Experimental Example 2

Figure 11:
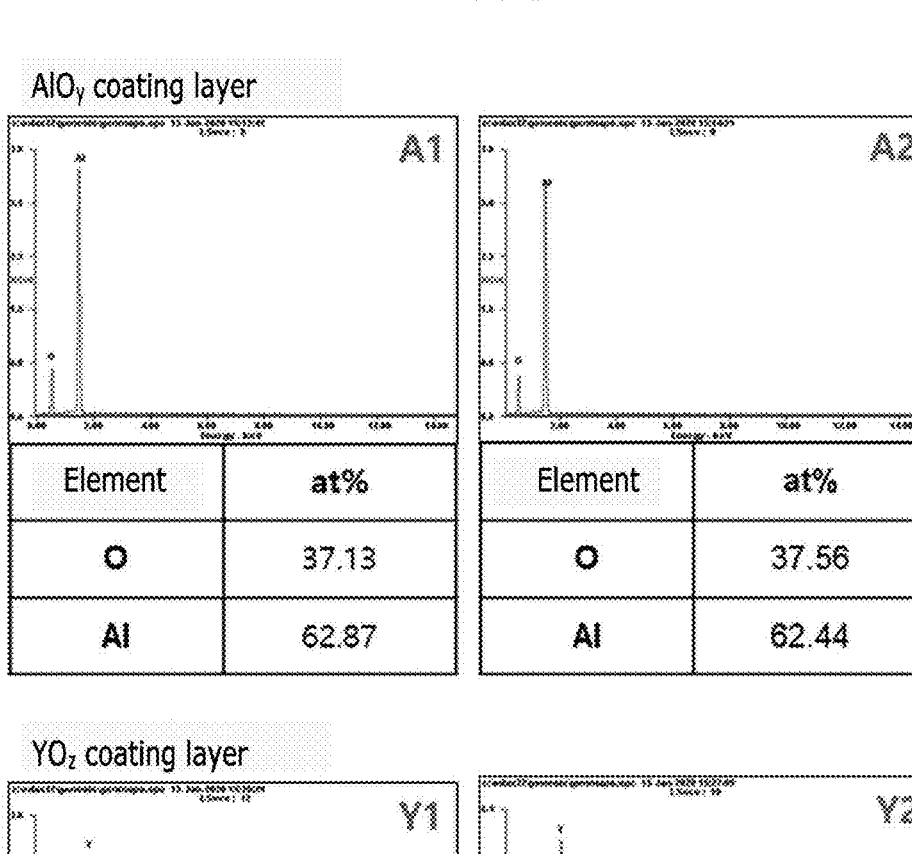
FIG. 11 is an XRD graph of each coating layer before heating the coating material prepared according to the second experimental example of the present invention.
Figure 11:
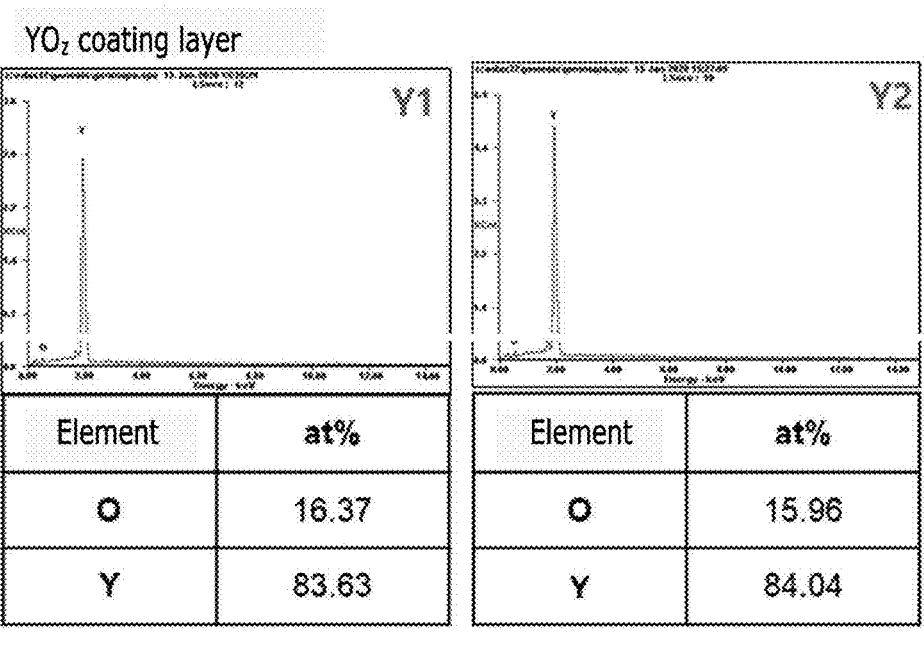

FIG. 11 shows an XRD graph of each coating layer before heating the coating material prepared according to the Experimental Example 2. Here, A means an $AlO_y$ coating layer while Y means a $Y_2O_z$ coating layer.

As shown in FIG. 11, the coating layers are sequentially stacked in the order of A1→Y1→A2→Y2. Here, at % of Al and O of the $AlO_y$ coating layer and at % of Y and O of the $YO_z$ coating layer are shown in a table. The ratio of Al and Y to O is within the aforementioned range. Depending on the experimental state, the fraction between Al and O and the fraction between Y and O may be slightly changed.

Figure 12:
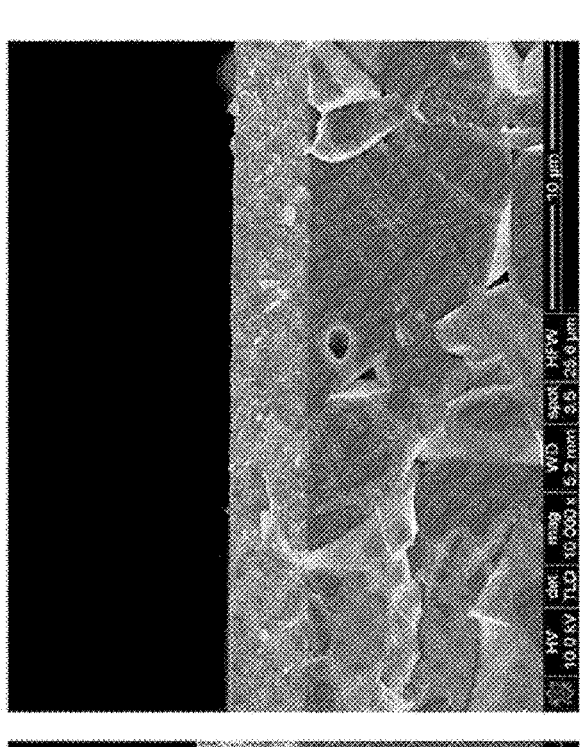
FIG. 12 is a scanning electron microscope photograph of the cross-section of the coating material before and after heating according to the second experimental example of the present invention.
Figure 12:
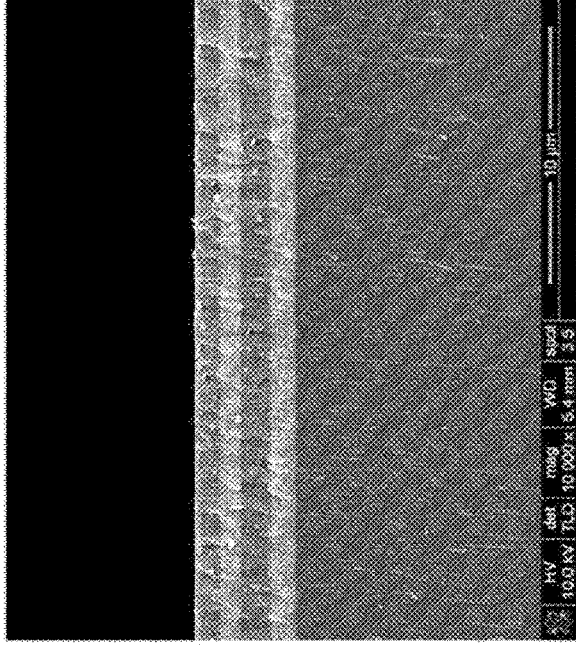

FIG. 12 shows a scanning electron microscope photograph of the cross-section of the coating material prepared before and after heating according to the second experimental example of the present invention. That is, the left side of FIG. 12 shows a scanning electron microscope photograph of the cross section of the coating material before heating, while the right side of FIG. 12 shows a scanning electron microscope photograph of the cross section of the coating material after heating.

As shown in the photo on the left side of FIG. 12, when a laminate is prepared by a physical vapor deposition method, it can be seen that a total of four layers of $Al_2O_3$ and $Y_2O_3$ are repeatedly formed. As a result of heating the laminate, as shown in the right picture of FIG. 12, it was confirmed that a single layer of $Y_3Al_5O_{12}$ (YAG) was formed by nucleation and recrystallization by mutual diffusion of the $Al_2O_3$ layer and the $Y_2O_3$ layer.

Figure 13:
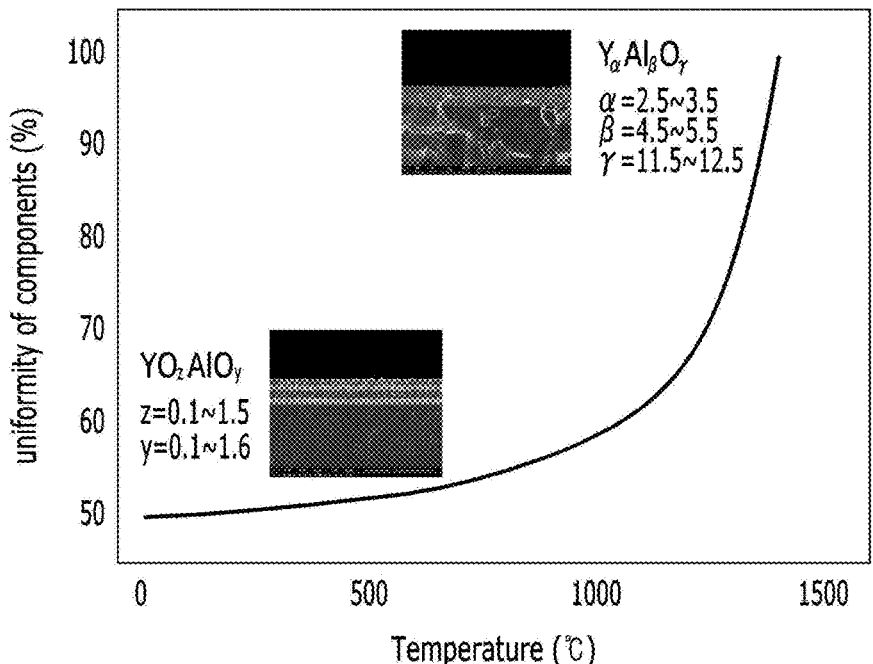
FIG. 13 is a schematic graph showing a process in which a plurality of coating layers are transformed into a single layer of coating material according to an increase in temperature in the second experimental example of the present invention.

FIG. 13 is a graph schematically showing a process in which coating layers forming a laminate is transformed into the coating material of a single layer according to an increase in temperature in the second experimental example of the present invention As shown in FIG. 13, a single layer of $Y_\alpha Al_\beta O_\gamma$ ($2.5 \leq \alpha \leq 3.5$, $4.5 \leq \beta \leq 5.5$, $11.5 \leq \gamma \leq 12.5$) is formed as mutual diffusion occurs between the $YO_z$ coating layers and the $AlO_y$ coating layers stacked with each other in accordance with the increase of temperature. That is, the $YO_z$ coating layer and the $AlO_y$ coating layer are formed of a uniform material as the heat treatment temperature increases.

Figure 14:
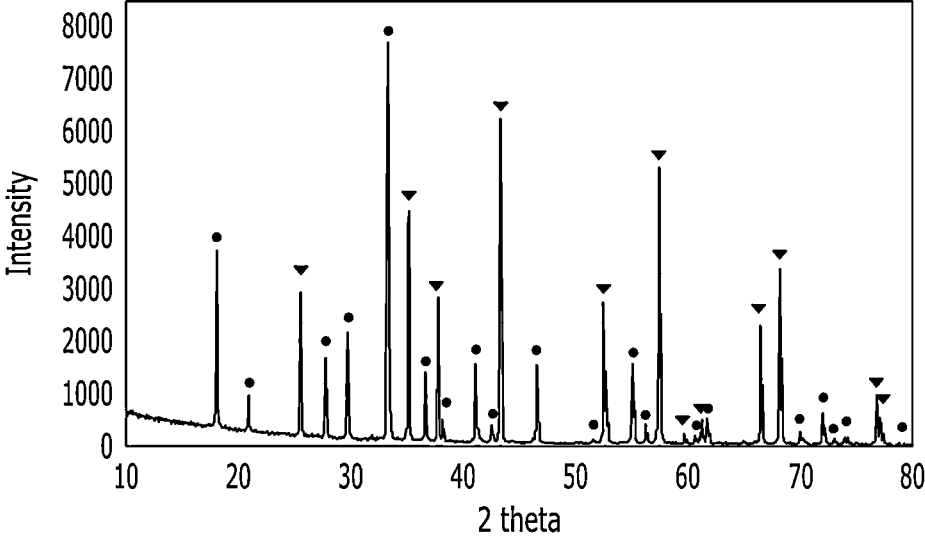
FIG. 14 is an XRD graph of the coating material prepared according to the second experimental example of the present invention.

FIG. 14 shows an XRD graph of the coating material prepared according to the second experimental example of the present invention. As shown in FIG. 14, as a result of XRD experiments, $Y_3Al_5O_{12}$ and $Al_2O_3$ were detected in the coating material. Here, it was confirmed that $Al_2O_3$ is a component of the substrate, and $Y_3Al_5O_{12}$ is a component of the coating layer. Therefore, it was confirmed that the coating layer of $Y_3Al_5O_{12}$ was formed well through the above methods.

Etching Experiment Results

Figure 15:
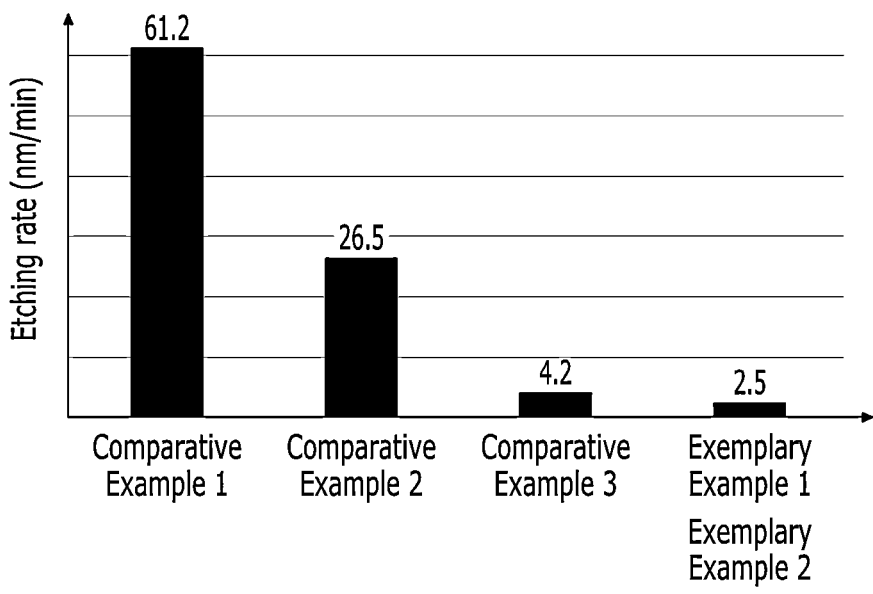
FIG. 15 is a graph showing the results of etching experiments according to Comparative Examples 1 to 3 and Experimental Examples 1 and 2.

FIG. 15 shows a graph of the etching test results according to Comparative Examples 1 to 3, Experimental Examples 1 and 2.

As shown in FIG. 15, as a result of performing an etching experiment, it was confirmed that the etching rate of the coating material was only 2.5 nm/min in Experimental Example 1 and Experimental Example 2 of the present invention. On the contrary, in the Comparative Examples 1 to 3, the etch rates were much larger than those of Experimental Examples 1 and 2 described above. For example, the etch rates were 61.2 nm/min for Comparative Example 1, 26.5 nm/min for Comparative Example 2, and 4.2 nm/min for Comparative Example 3. Therefore, it was confirmed that the coating materials prepared through Experimental Example 1 and Experimental Example 2 of the present invention described above has excellent etching rates and are suitable for use in a plasma corrosion environment.

Although the present invention has been described as described above, those skilled in the art to which the present invention pertains will readily appreciate that various modifications and variations are possible without departing from the concept and scope of the claims set forth below.

REFERENCE NUMERALS 10. substrate
101. surface
20. first coating portion
30. second coating portion
40. laminate
50. coating layer
100, 200. coating material

What is claimed is:

1. A method for manufacturing a coating material formed on an inner surface of a chamber, the method comprising:

providing a substrate comprising at least one material selected from the group consisting of SiC, $SiO_2$, and $Al_2O_3$;

providing a first coating portion with a thickness of 0.4 μm to 1 μm comprising $AlO_y$ ($0.1 \leq y \leq 1$ as a molar ratio) on the substrate by physical vapor deposition;

providing a second coating portion with a thickness of 0.5 μm to 2.5 μm comprising $YO_z$ ($0.1 \leq z \leq 1$ as a molar ratio) on the first coating portion by physical vapor deposition;

providing a laminate in which the first coating portion and the second coating portion are repeatedly stacked; and heating the laminate to provide a coating layer of a single crystalline layer by a solid-state reaction between the first coating portion and the second coating portion.

2. The method of claim 1, wherein the substrate comprises the $Al_2O_3$ in the providing the substrate, the laminate is heated at 1000° C. to 1500° C., and the coating layer comprises $Y_\alpha Al_\beta O_\gamma$ ($2.5 \leq \alpha \leq 3.5$, $4.5 \leq \beta \leq 5.5$, $11.5 \leq \gamma \leq 12.5$ as a molar ratio) in the providing the coating layer.

3. The method of claim 1, wherein the substrate comprises the $Al_2O_3$ in the providing the substrate, the laminate is heated at 1000° C. to 1500° C., and the coating layer comprises at least one compound selected from the group consisting of $Y_3Al_5O_{12}$, $YAlO_4$, and $Y_4Al_2O_9$ in the providing the coating layer.

4. The method of claim 3, wherein a ratio of the thickness of the second coating portion to the thickness of the first coating portion is 0.8 to 1.2 when the coating layer comprises $Y_3Al_5O_{12}$ in the providing the laminate.

5. The method of claim 3, wherein a ratio of the thickness of the second coating portion to the thickness of the first coating portion is 1.3 to 1.8 when the coating layer comprises $YAlO_4$ in the providing the laminate.

6. The method of claim 3, wherein the ratio of the thickness of the second coating portion to the thickness of the first coating portion is 1.6 to 2.5 when the coating layer comprises $Y_4Al_2O_9$ in the providing the laminate.

7. The method of claim 1, wherein the laminate is heated to 800° C. to 1300° C., the thickness of the coating layer is smaller than the thickness of the laminate, and a ratio of the thickness of the laminate to the thickness of the coating layer is 1.25 to 1.6 In the providing the coating layer.

8. The method of claim 1, wherein the first coating portion and the second coating portion are repeatedly stacked 2 to 10 times in the providing the laminate.

9. The method of claim 1 further comprising treating surface of the substrate between the providing a substrate and the providing a first coating portion and the surface treatment is performed by plasma or ion beam and the surface roughness (Ra) of the substrate is in a range from 0.1 μm to 0.3 μm.

10. The method of claim 9, wherein a power of the ion beam is 0.5 KW to 3 KW when the surface treatment is performed by the ion beam.

* * * * *